United States Patent [19]
Jeong

[11] Patent Number: 6,002,616
[45] Date of Patent: Dec. 14, 1999

[54] REFERENCE VOLTAGE GENERATING CIRCUIT OF SENSE AMPLIFIER USING RESIDUAL DATA LINE

[75] Inventor: Bong-Hwa Jeong, Seoul, Rep. of Korea

[73] Assignee: LG Semicon Co., Ltd., Choongcheongbuk-Do, Rep. of Korea

[21] Appl. No.: 09/033,163

[22] Filed: Mar. 2, 1998

[30] Foreign Application Priority Data

Mar. 4, 1997 [KR] Rep. of Korea .................. 97-6988

[51] Int. Cl.$^6$ ................................................ G11C 16/04
[52] U.S. Cl. .......................... 365/189.09; 365/189.02; 365/205; 365/207
[58] Field of Search .................. 365/189.09, 189.02, 365/205, 207, 208

[56] References Cited

U.S. PATENT DOCUMENTS

| | | | |
|---|---|---|---|
| 5,383,162 | 1/1995 | Shirai et al. | 365/231 |
| 5,517,462 | 5/1996 | Iwamoto et al. | 365/233 |
| 5,659,517 | 8/1997 | Arimoto et al. | 365/226 |
| 5,717,652 | 2/1998 | Ooishi | 365/233 |
| 5,812,455 | 9/1998 | Iwata et al. | 365/185.18 |

OTHER PUBLICATIONS

Toshiyuki Sakuta, et al., "Circuit Techniques for Multi–bit Parallel Testing of 64Mb DRAMs and Beyond"; 1992 Symposium on VLSI Circuits, Digest of Technical Papers; pp. vi, vii, 60 and 61; Jun. 4–6, 1996/Seattle.

*Primary Examiner*—David Nelms
*Assistant Examiner*—Hien Nguyen
*Attorney, Agent, or Firm*—Morgan, Lewis & Bockius LLP

[57] ABSTRACT

A reference voltage generating circuit of a sense amplifier using a residual data line which has the effect of reducing a layout and setting an accurate reference voltage by using a residual data line as a reference voltage, includes N memory cell arrays comprising cell blocks for storing data, N+1 sense amplifiers located over and below the memory cell arrays for reading out data from the selected cell block in the memory cell array to amplify to a predetermined level and output, a multiplexor for selectively outputting data outputted from the N+1 sense amplifiers in accordance with externally inputted data line select signal, a reference voltage generator for setting as a reference voltage a signal value of a non-adopted line of the sense amplifier according to the sense amplifier located at both ends of the memory cell array, and N data bus sense amplifiers for comparing data transmitted from the multiplexor with the reference voltage transmitted from the reference voltage generator.

7 Claims, 6 Drawing Sheets

REFERENCE VOLTAGE GENERATING CIRCUIT OF SENSE AMPLIFIER USING RESIDUAL DATA LINE

BACKGROUND OF THE INVENTION

1. Field of the Invention

The present invention relates to a circuit for setting a reference voltage for sensing data from a memory cell, and more particularly, to a reference voltage generating circuit of a sense amplifier using a residual data line which is capable of obtaining an accurate reference voltage and reducing a layout without an additional dummy line by utilizing a residual data line due to a construction of an alternative shared sense amplifier as a reference voltage.

2. Description of the Conventional Art

As shown in FIG. 1, a core block construction showing a part of a conventional memory includes a memory cell array 10 comprising cell blocks for storing data, sense amplifiers 20,30 respectively located over and below the memory cell array 10 for reading out data from the selected cell block on the memory cell array 10 and amplifying it to a predetermined level, and sense amplifier driving units 40,50 for driving the sense amplifiers 20,30.

That is, it is constructed in a folded bit line that memory cells are arranged in every other line to respectively output data signals in accordance with the sense amplifiers located over and below the memory cell.

The above-described conventional construction will now be described in detail.

When data is read or not written, a sense amplifier enable signal (SAEN) becomes low level and a sense amplifier equalizer signal (SAEQ) becomes high level. Here, an inverted version (/SAEN) of the sense amplifier enable signal (SAEN) is a high level signal.

Accordingly, NMOS transistors (N1,N3) of the first and second driving units 40,50 are turned on and NMOS transistors (N2,N4) of the first and second driving unite 40,50 are turned off. As a result, an SP power line and an SN power line are connected to have each same voltage.

Then, since there is no voltage difference between the SP power line and the SN power line, the sense amplifiers 20,30 are not operated.

In an operation thereof, that is, when a data signal is read out from a memory cell array or a data is written on the memory cell array, first, if a cell block is set in the memory cell array 10, a block select signal of the cell block becomes high level and the sense amplifier enable signal (SAEN) becomes high level, and the sense amplifier equalizer signal (SAEQ) becomes low level.

Therefore, the NMOS transistors (N1,N3) of the first and second driving units 40,50 are turned off and the others are turned on. As a result, since the SP power line is charged with a source voltage and the SN power line becomes a ground voltage, the sense amplifiers 20,30 enter an operable state.

Here, when one of the word lines (WL0–WLn) of the memory cell array 10 is selected, the cell block corresponding to the selected word line is sensed by using the data lines in the sense amplifiers 20,30 to read or write a data signal.

The sense amplifiers 20,30 operated in the above way has a construction of an alternative shared sense amplifier.

When the data signal is read out and outputted, the signal is outputted through a peripheral circuit such as a multiplexor and a data bus sense amplifier of FIG. 2, which will be explained as follows.

The sense amplifiers (SA) are provided over and below the memory cell array comprising cell blocks, which construction is connected in a plurality of numbers.

Here, the example of the construction comprising four memory cell arrays and five sense amplifiers (SA) will be explained.

In FIG. 2, when one memory cell array is called a top memory cell array, the one located therebelow is a bottom memory cell array, and when one memory cell array is called a bottom memory cell array, the one located thereover is a top memory cell array.

Accordingly, as shown in FIG. 2, the construction is repeated in such a manner as the top memory cell array (TOP)→the bottom memory cell array (BOT)→the top memory cell array (TOP)→the bottom memory cell array (BOT), and the sense amplifier (SA) is provided at both directions of the top and bottom memory cell arrays.

For example, when one memory containing cell blocks is determined as the top memory cell array, the data signal outputted from the cell block of the selected memory cell array passes through the sense amplifiers (SA1,SA2,SA3,SA4) separately located over and below of the memory cell array to be amplified to a predetermined level and then passes through the data lines (SO1,SO2,SO3,SO4) to be transmitted to a multiplexor 60.

The data line has two kinds of signals SO and SOb which is a reverse version of SO, and the data line of this invention includes one of the two signals.

The multiplexor 60 which has received the data signals through the data lines (SO1,SO2,SO3,SO4) selects the data signals transmitted from the sense amplifiers (SA1,SA2) in accordance with an inputted data line select signal (SO-SEL) to transmit to data bus sense amplifiers (DBSA1–DBSA4).

The data bus sense amplifiers (DBSA1–DBSA4) compare the transmitted data signals with a reference voltage (SOREF) to output 1 or 0, or to determine PASS or FAIL and output the selected one.

Here, the reference voltage (SOREF) forms a dummy line (L-DUMMY) to make loading (LOADING) identical to a data voltage in order to have less effect of external noise.

The thusly formed dummy line is connected to the data line SO or SOb initially pre-charged thereby to set the voltage pre-charged in the data line as a reference voltage (SOREF). Here, the dummy line (L-DUMMY) and the data lines (SO,SOb) are connected by a switch (not shown).

When the sense amplifier starts operating, the switch is turned off to disconnect the data lines (SO,SOb) connected to the dummy line (L-DUMMY).

Then, the data bus sense amplifiers (DBSA1–DBSA4) compare the data voltage transmitted from the multiplexor 60 with a reference voltage (SOREF) outputted from the dummy line (L-DUMMY) and outputs the resultant compared value.

When the bottom memory cell array in the cell block is selected, the data signal outputted from the cell block of the selected memory cell array passes through the sense amplifiers (SA1,SA2,SA3,SA4) separately located over and below the memory cell array to be amplified to a predetermined level and then passes through the data lines (SO1, SO2,SO3,SO4) to be transmitted to the multiplexor 60.

The multiplexor 60 which has received the data signals through the data lines (SO1,SO2,SO3,SO4) selects the data signal transmitted from the sense amplifiers (SA1,SA2) in accordance with the inputted data line select signal (SO-SEL) to transmit to data bus sense amplifiers (DBSA1–DBSA4).

The data bus sense amplifiers (DBSA1–DBSA4) compare the transmitted data signals with a reference voltage (SOREF) to output 1 or 0, or to determine PASS or FAIL and output the selected one.

Here, the reference voltage (SOREF) forms a dummy line (L-DUMMY) to make loading (LOADING) identical to that of the data voltage and the thusly formed dummy line is connected to the data line SO or SOb initially pre-charged thereby to set the voltage pre-charged in the data line as a reference voltage (SOREF).

Here, the dummy line (L-DUMMY) and the data lines (SO,SOb) are connected by a switch (not shown).

When the sense amplifier starts operating, the switch is turned off to disconnect the data lines (SO,SOb) connected to the dummy line (L-DUMMY).

Then, the data bus sense amplifiers (DBSA1–DBSA4) compare the data voltage transmitted from the multiplexor 60 with a reference voltage (SOREF) outputted from the dummy line (L-DUMMY) and outputs the resultant.

Here, the data bus sense amplifier (DBSA) outputs 1 or 0 in a normal mode, and determines PASS or FAIL to output in a test mode, on which description will be given with reference to FIG. 3.

When an address transition detecting signal (ATD) for enabling the sense amplifier is enabled, transistors (Q5,Q10) of first and second data comparators 71 are turned on, respectively.

If data (DATA) having a level higher than a reference voltage (Vref) is inputted when the transistors (Q5,Q10) are turned on and thereby differential amplifiers 71a,71b are operable, the transistor (Q3) of the first differential amplifier 71a is turned on and the transistor (Q4) thereof is turned off, and the transistor (Q8) of the second differential amplifier 71b is turned on and the transistor (Q9) thereof is turned off.

Therefore, a high level signal is outputted through a first output node (N1) connected to a drain terminal of the transistor (Q4) and a low level signal is outputted through a second output node (N2) connected to a drain terminal of the transistor (Q8).

Here, the second data comparator 72 operated by receiving an inverted version (/DATA) of the data (DATA) outputted from the first data comparator 71 outputs a low level signal through a third output node (N3) and a high level signal through a fourth output node (N4).

That is, the second data comparator 72 outputs an inverted value of the output value from the first data comparator 71.

Accordingly, high, low, high, and low level signals are respectively inputted to inverters (I1–I4) of a compression unit 73.

Then the inverters (I1–I4) inverts input signals to output low, high, low and high level signals to NOR gates (NR1, NR2), which receive the low and high level signals, respectively and performing a NORing on each signal, and output the NORed low level signals to an output buffer 74, respectively.

On the other hand, when the value of data (DATA) inputted to the first data comparator 71 is lower than the value of the reference voltage (Vref), the transistor (Q3) of the first differential amplifier 71a is turned off and the transistor (Q4) thereof is turned on, and the transistor (Q8) of the second differential amplifier 71b is turned off and the transistor (Q9) thereof is turned on.

Therefore, a low level signal is outputted through a first output node (N1) connected to a drain terminal of the transistor (Q4) and a high level signal is outputted through a second output node (N2) connected to a drain terminal of the transistor (Q8).

Then, a high level signal is outputted through the third output node (N3) of the second data comparator 72 and a low level signal is outputted through the fourth output node (N4).

Accordingly, low, high, low and high level signals are respectively inputted to the inverters (I1–I4) of the compression unit 73.

Then, the inverters (I1–I4) inverts the input signals to respectively output high, low, high and low level signals to the NOR gates (NR1,NR2), which receive the high and low level signals, respectively and performing a NORing on each signal, and output the NORed low level signals to an output buffer 74, respectively.

Accordingly, in a normal mode, the output buffer 74 outputs 1 (a high level signal) or 0 (a low level signal) which is a value resulting from data comparing, and in a test mode, when the values outputted from the compression unit 73 are all zero (0,0), the values are processed as a PASS state (which means a cell is normal) and processed as a FAIL state (which means a cell is abnormal) in the other cases.

By the above-described method, the cells including defects can be detected.

The data bus sense amplifier (DBSA) operated in the above described way is disclosed in "Circuit Techniques for Multi-Bit Parallel Testing Of 64 Mb DRAMs and Beyond" contained in SYMPOSIUM ON VLSI CIRCUIT in 1992.

However, since a dummy line for setting a reference value is separately provided, it is not externally influenced to the same degree as the data line. Therefore, when the electrical potential of the ground (GND) is unstable, that is, not stabilized to be zero (0), a high possibility exists that the dummy line for setting a reference value has a different value from that of the data line. More disadvantageously, in a normal mode, data is reversely outputted and in a test mode, PASS and FAIL can be reversed, and a separate dummy line for setting a reference value is needful, resulting in wasting a layout.

SUMMARY OF THE INVENTION

Accordingly, it is an object of the present invention to provide a reference voltage generating circuit of a sense amplifier using a residual data line which is capable of reducing a layout without an additional dummy line by utilizing a residual data line due to a construction of an alternative shared sense amplifier as a reference voltage.

It is another object of the present invention to provide a reference voltage generating circuit of a sense amplifier using a residual data line which is capable of obtaining an accurate reference voltage by utilizing a residual data line due to a construction of an alternative shared sense amplifier as a reference voltage.

To achieve the above object, there is provided a reference voltage generating circuit of a sense amplifier using a residual data line which includes N memory cell arrays comprising cell blocks for storing data, N+1 sense amplifiers located over and below the memory cell arrays for reading out data from the selected cell block in the memory cell array to amplify to a predetermined level and output, a multiplexor for selectively outputting data outputted from the N+1 sense amplifiers in accordance with externally inputted data line select signal, a reference voltage generator for setting as a reference voltage a signal value of a non-adopted line of the sense amplifier according to the sense amplifier located at both ends of the memory cell array, and N data bus sense amplifiers for comparing data transmitted from the multiplexor with the reference voltage transmitted from the reference voltage generator.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The reference voltage generating circuit of a sense amplifier using a residual data line will now be described in detail with reference to the accompanying drawings.

Figure 1:
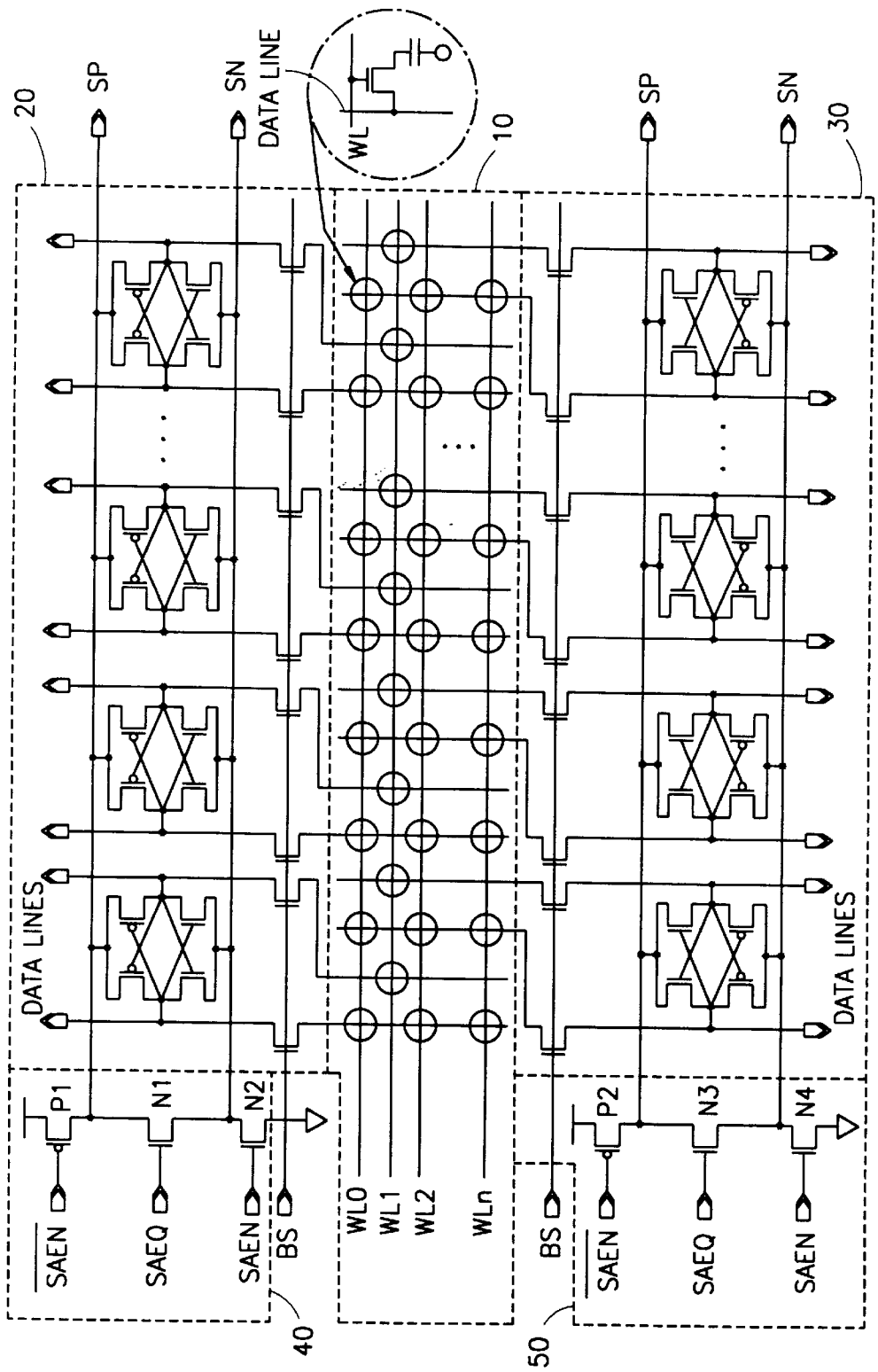
FIG. 1 is a view of a core block construction showing a part of a conventional memory.
Figure 2:
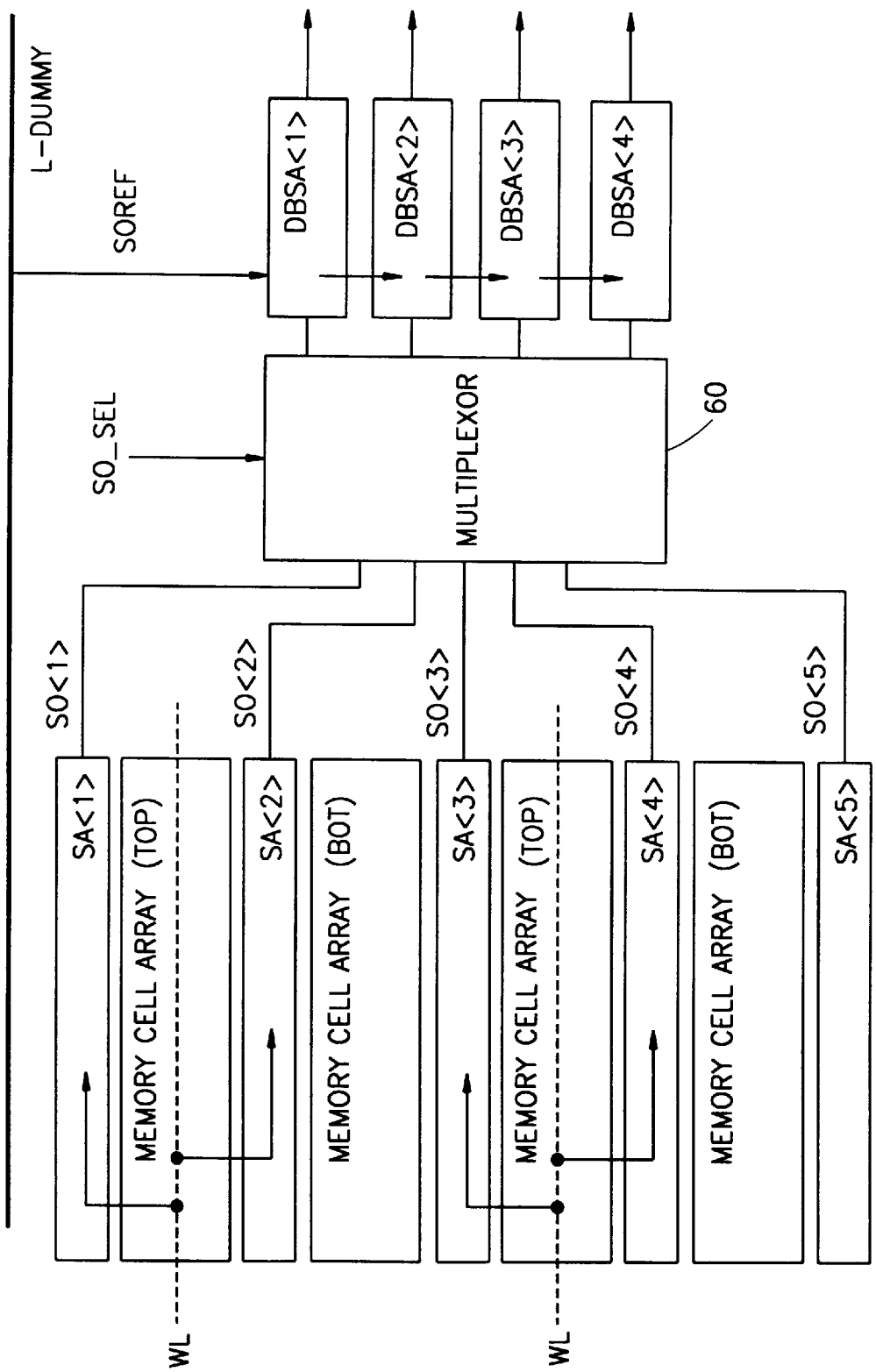
FIG. 2 is a schematic view showing a data output path of FIG. 1.
Figure 3:
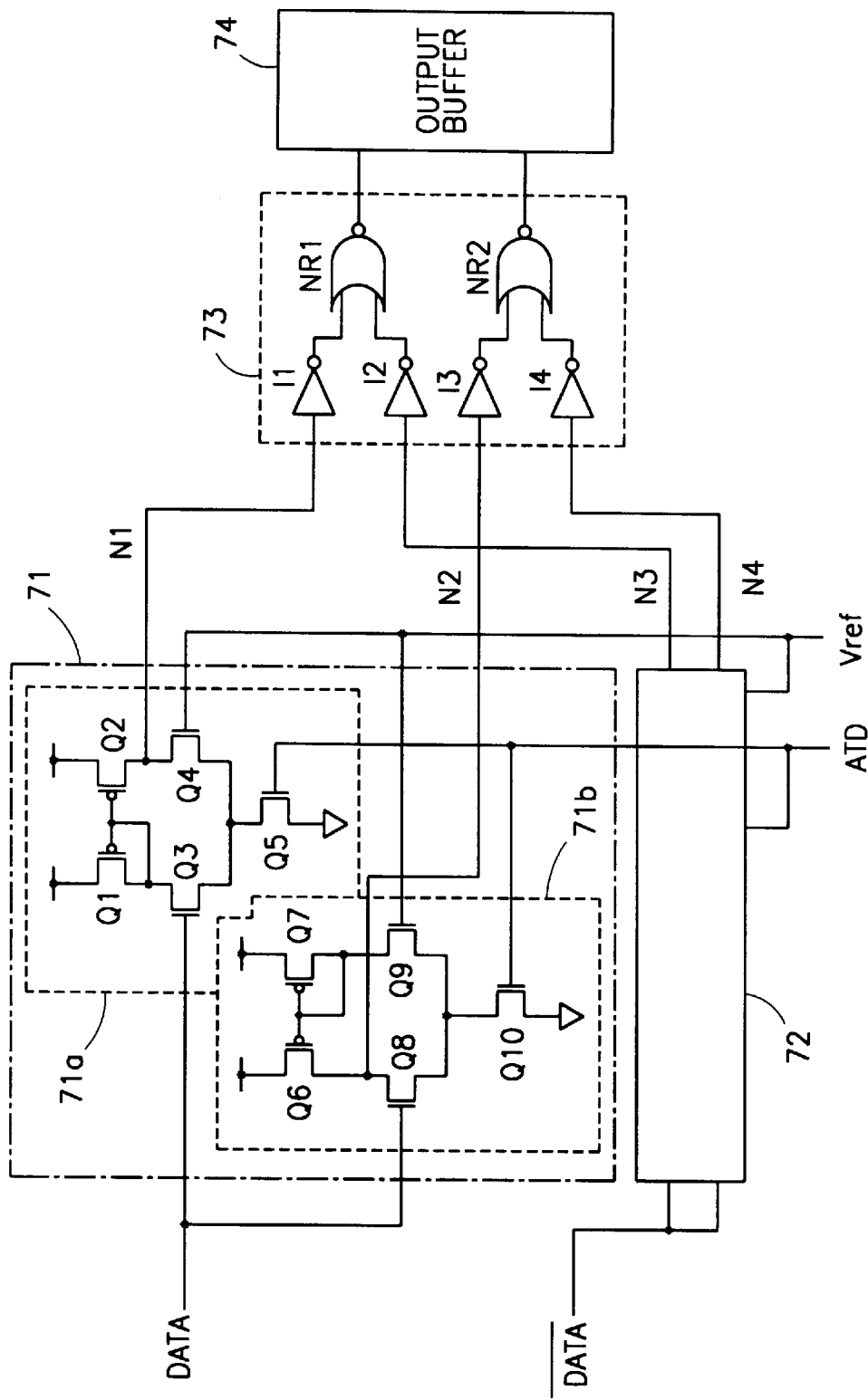
FIG. 3 is a detailed circuit diagram of a data bus sense amplifier of FIG. 2.
Figure 4:
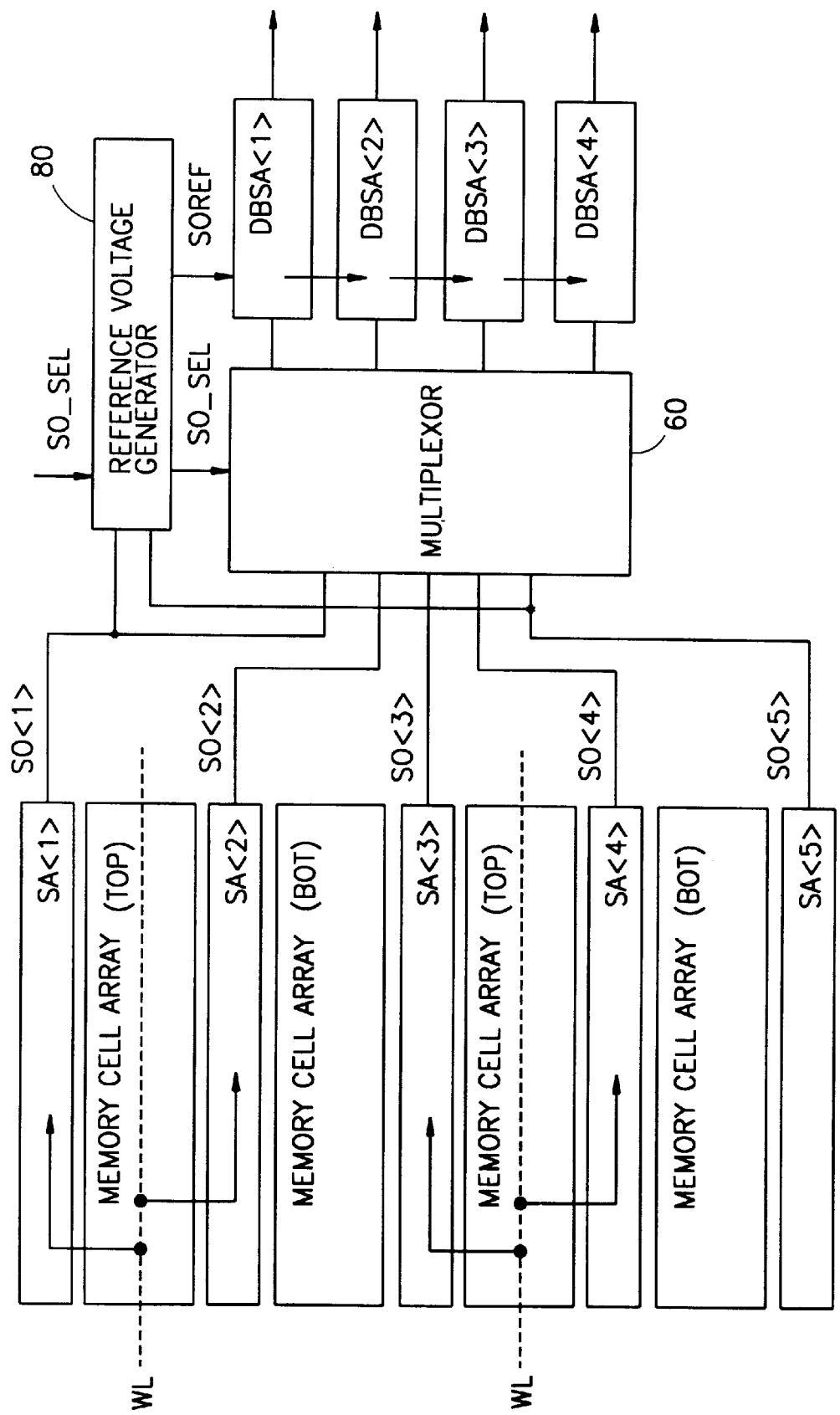
FIG. 4 is a circuit diagram of a reference voltage generating circuit of a sense amplifier using a residual data line according to the present invention.

FIG. 4 is a circuit diagram of a reference voltage generating circuit of a sense amplifier using a residual data line according to the present invention. As shown in this drawing, the reference voltage generating circuit of a sense amplifier using a residual data line includes, N memory cell arrays comprising cell blocks for storing data, N+1 sense amplifiers located over and below the memory cell arrays for reading out data of the selected cell block in the memory cell array to amplify to a predetermined level and output, a multiplexor for selectively outputting data outputted from the N+1 sense amplifiers in accordance with externally inputted data line select signal (SO-SEL), a reference voltage generator for setting as a reference voltage a signal value of an unselected line out of the N+1 data lines in accordance with the sense amplifier located at both ends of the memory cell array, and N data bus sense amplifiers for comparing data transmitted from the multiplexor with the reference voltage transmitted from the reference voltage generator.

Figure 5:
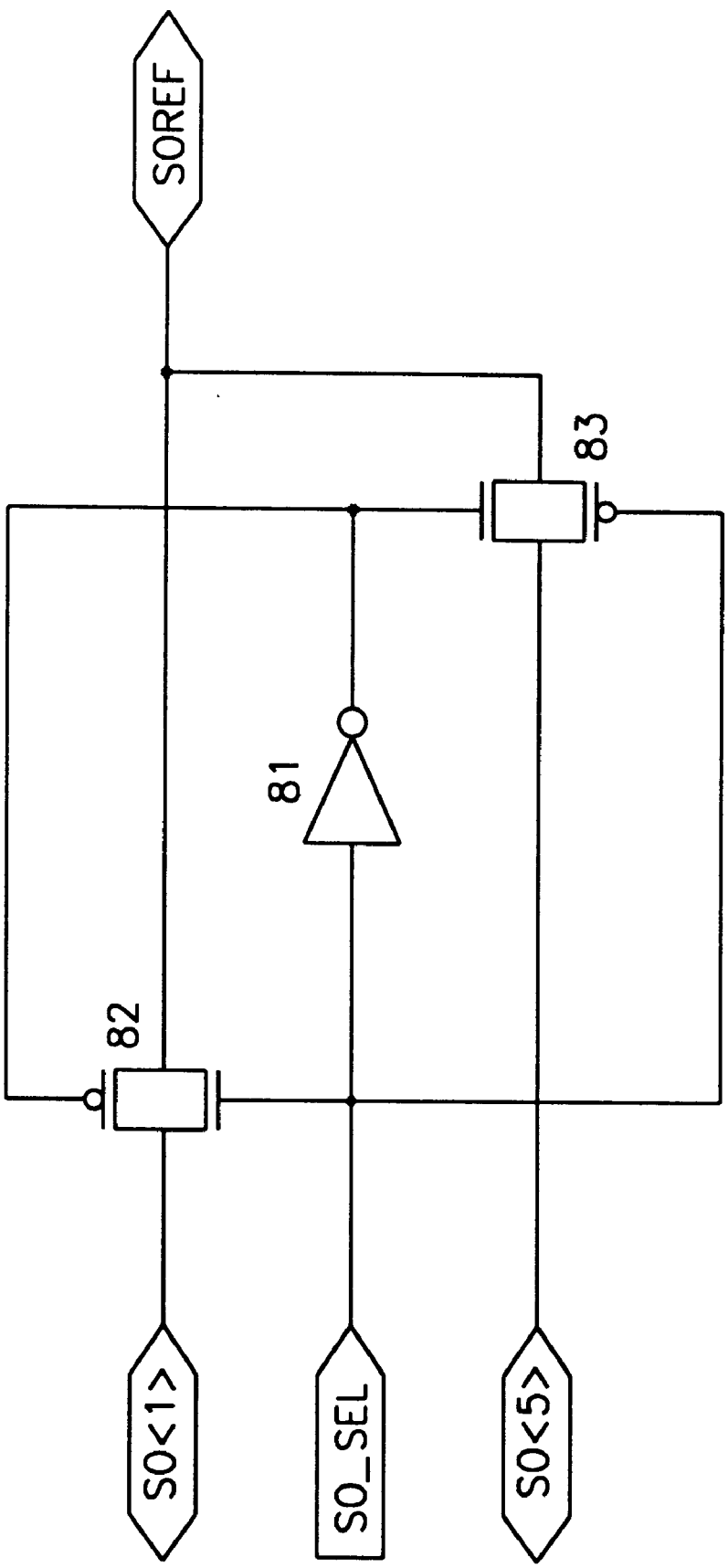
FIG. 5 is a detailed diagram of a reference voltage generator of FIG. 4.

FIG. 5 is a detailed diagram of a reference voltage generator of FIG. 4. As shown in this drawing, the data bus sense amplifier (DBSA) includes an inverter 81 for receiving data line select signal (SO-SEL) to invert and output, a first transmission gate 82 for transmitting a level of the data outputted from the data line of the uppermost sense amplifier as a reference voltage (SOREF) by being turned on or off in accordance with the data line select signal (SO-SEL) inputted through a non-inverting terminal and an output signal from the inverter 81 inputted through an inverting terminal, and a second transmission gate 83 for transmitting a level of the data outputted from the data line of the lowermost sense amplifier as a reference voltage (SOREF) by being turned on or off in accordance with the data line select signal (SO-SEL) inputted through the inverting terminal and an output signal from the inverter 81 inputted through the non-inverting terminal.

The operation and effect of the present invention having the above construction will now be described in detail.

As shown in FIG. 4, the memory cell block is divided into a top memory cell array and a bottom memory cell array, to select one row out of a plurality of rows.

When a cell block is selected in the memory cell array, at least one of top or bottom memory cell arrays is selected.

For example, when a top memory cell array is selected in the cell block, the first through fourth sense amplifiers (SA1–SA4) sense data signals from the cell block in the top memory cell array to amplify to a predetermined level and output through the data lines (SO1–SO4).

Here, the data lines (SO1–SO4) include a data output signal SO and the reverse signal SOb, one of which is used in the present invention.

Here, a fifth sense amplifier (SA5) in the lowermost is not operated, and accordingly, a data line (SO5) of the fifth sense amplifier (SA5) keeps the initially pre-charged voltage.

Therefore, the reference voltage generator 80 selects the data line (SO5) of the fifth sense amplifier (SA5) in accordance with the externally inputted data line select signal (SO-SEL) and uses the voltage initially pre-charged in the data line (SO5) as a reference voltage.

When the bottom memory cell array is selected from the cell block, the second through fifth sense amplifiers (SA2–SA5) sense the data signals in the bottom memory cell array to amplify to a predetermined level and output through the data lines (SO2–SO5).

Here, the first sense amplifier (SA1) in the uppermost is not operated, and accordingly, the data line (SO1) of the first sense amplifier (SA1) keeps the initially pre-charged voltage.

Therefore, the reference voltage generator 80 selects the data line (SO1) of the first sense amplifier (SA1) in accordance with the externally inputted data line select signal (SO-SEL) and uses the voltage initially pre-charged in the data line (SO1) as a reference voltage.

The multiplexor 60 outputs the data signal selected in accordance with the externally inputted data line select signal (SO-SEL) to the data bus sense amplifiers (DBSA1–DBSA4).

The data bus sense amplifiers (DBSA1–DBSA4) compare the reference voltage (SOREF) generated from the reference voltage generator 80 with the data outputted from the multiplexor 60 and output the resultant.

With reference to FIG. 5, the reference voltage generator 80 will be explained. First, when the reference voltage generator 80 receives the data line select signal (SO-SEL) for discriminating the top and bottom memory cell arrays in order to output a stored data signal of the cell while keeping the data lines SO,SOb to have a predetermined level during the time for initially setting the reference voltage, if the top memory cell array is selected, the data line of the lowermost memory cell array is selected, and if the bottom memory cell array is selected, the data line of the uppermost memory cell array is selected and the voltage pre-charged in the data line is used as a reference voltage (SOREF).

That is, when the data line select signal (SO-SEL) for discriminating the top and bottom memory cell arrays selects the top memory cell array, a low level signal is inputted to the inverter 81.

Accordingly, a high level signal inverted through the inverter 81 is inputted to the inverting terminal of the first transmission gate 82 and to the non-inverting terminal of the second transmission gate 83, and a low level of the select signal (SO-SEL) is inputted to the non-inverting terminal of the first transmission gate 82 and the inverting terminal of the second transmission gate 83. Consequently, the first transmission gate 82 is turned off and the second transmission gate 83 is turned on, and thus the voltage of the data line (SO5) of the lowermost fifth sense amplifier (SA5) is transmitted to be used as a reference voltage (SOREF).

When the bottom memory cell array is selected in accordance with the data line select signal (SO-SEL), a high level signal is inputted to the inverter 81.

Accordingly, a low level signal inverted through the inverter 81 is inputted to the inverting terminal of the first transmission gate 82 and to the non-inverting terminal of the second transmission gate 83, and a high level of the select signal (SO-SEL) is inputted to the non-inverting terminal of the first transmission gate 82 and the inverting terminal of the second transmission gate 83. Consequently, the second transmission gate 83 is turned off and the first transmission gate 82 is turned on, and the voltage of the data line (SO1) of the lowermost first sense amplifier (SA1) is transmitted to be used as a reference voltage (SOREF).

Since the select signal (SO-SEL) is a signal faster than the operation of the sense amplifier, a reference voltage is set in a quick time.

Figure 6:
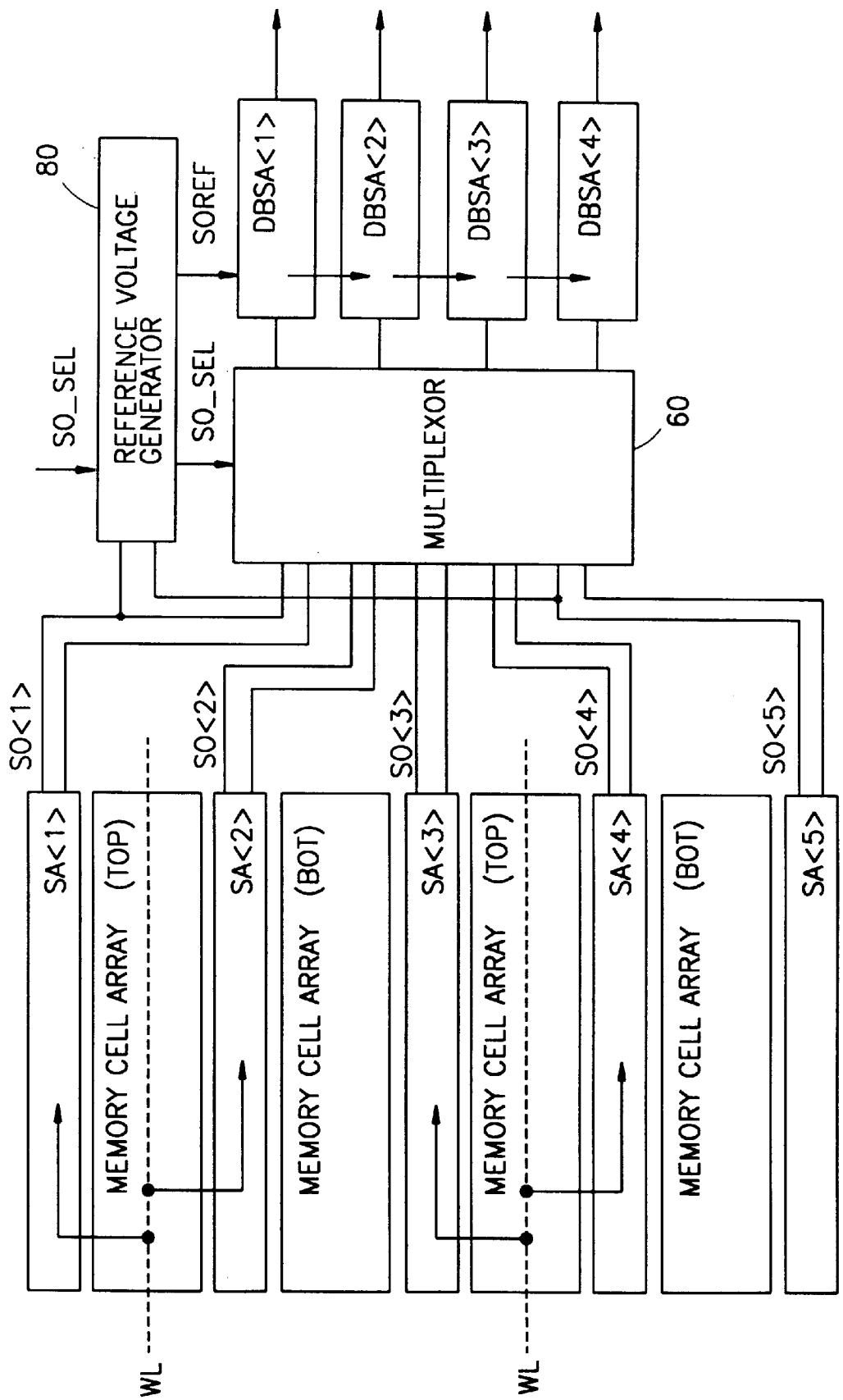
FIG. 6 is another embodiment of the present invention.

FIG. 6 is another embodiment of the present invention. As shown in this drawing, when a plurality of the data lines are connected to the sense amplifier, only one line is sufficient to be used as a reference voltage. Therefore, FIG. 6 shows the example when only one data line is selected to be used as a reference voltage.

As described in detail above, in the present invention having the construction of employing the alternative shared sense amplifier, when the uppermost or lowermost data lines is not used, one line is selected to be used as a line for a reference voltage thereby to set an accurate reference voltage. As a result, there is no need for providing a separate dummy line for setting a reference voltage, resulting in reducing a layout.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A reference voltage generating circuit of a sense amplifier, comprising:

N memory cell arrays comprising cell blocks for storing data;

N+1 sense amplifiers coupled to the N memory cell arrays for reading out data of a selected cell block in the memory cell array, the sense amplifiers having N+1 data lines;

a reference voltage generator for setting a signal value from an unselected line out of the N+1 data lines as a reference voltage;

a multiplexor for selectively outputting data from the N+1 sense amplifiers in accordance with an externally inputted data line select signal; and N data bus sense amplifiers for comparing data transmitted from the multiplexor with the reference voltage transmitted from the reference voltage generator.

2. The circuit of claim 1, wherein the N data bus sense amplifier comprises:

an inverter for receiving the data line select signal to invert and output;

a first transmission gate for transmitting a level of the data outputted from the data line of the uppermost sense amplifier as the reference voltage by being turned on or off in accordance with the data line select signal inputted through a non-inverting terminal and an output signal from the inverter inputted through an inverting terminal; and a second transmission gate for transmitting a level of the data outputted from the data line of the lowermost sense amplifier as the reference voltage by being turned on or off in accordance with the data line select signal inputted through the inverting terminal and an output signal from the inverter inputted through the non-inverting terminal.

3. The circuit of claim 1, wherein the unselected data line includes one of the data lines of the uppermost or lowermost sense amplifier.

4. The circuit of claim 1, wherein the signal value from the unselected line includes a precharged voltage in the N+1 data lines.

5. The circuit of claim 1, wherein the N+1 sense amplifiers are attached on the top and bottom of each of the N memory cell arrays.

6. The circuit of claim 1, wherein the N memory cell arrays include at least two memory cell arrays.

7. The circuit of claim 1, wherein the N+1 data lines include at least three data lines.

* * * * *